United States Patent [19]

Charbonnier et al.

[11] Patent Number: 4,636,733
[45] Date of Patent: Jan. 13, 1987

[54] QUATERNARY FREQUENCY SYNTHESIZER

[75] Inventors: Roger Charbonnier, Meudon Bellevue; Jöel Remy, Paris, both of France

[73] Assignee: Adret Electronique, France

[21] Appl. No.: 686,856

[22] Filed: Dec. 27, 1984

[30] Foreign Application Priority Data

Feb. 22, 1984 [FR] France .................................. 84 02667

[51] Int. Cl.[4] ............................................ H03B 19/00
[52] U.S. Cl. ........................................ 328/14; 328/158; 328/159; 331/38
[58] Field of Search ........................ 328/14, 158, 159; 331/38

[56] References Cited

U.S. PATENT DOCUMENTS

| | | | |
|---|---|---|---|
| 2,888,557 | 5/1959 | Schneider | 328/159 |
| 3,845,396 | 10/1974 | Rutman | 328/14 |
| 4,008,443 | 2/1977 | Remy | 328/14 |
| 4,458,329 | 7/1984 | Remy | 328/14 |

Primary Examiner—John S. Heyman
Attorney, Agent, or Firm—William A. Drucker

[57] ABSTRACT

A decimal frequency synthesizer in which, for each decade, two identical sets of four arithmetic progression frequencies are generated by programmed frequency divisions effected in parallel from a standard frequency and applied to two mixers. The first mixer further receives the frequency from the preceding decade and is followed by a divide-by-2 divider, whereas the second mixer is further receives the output of said divider and is followed by a divide-by-5 divider.

9 Claims, 5 Drawing Figures

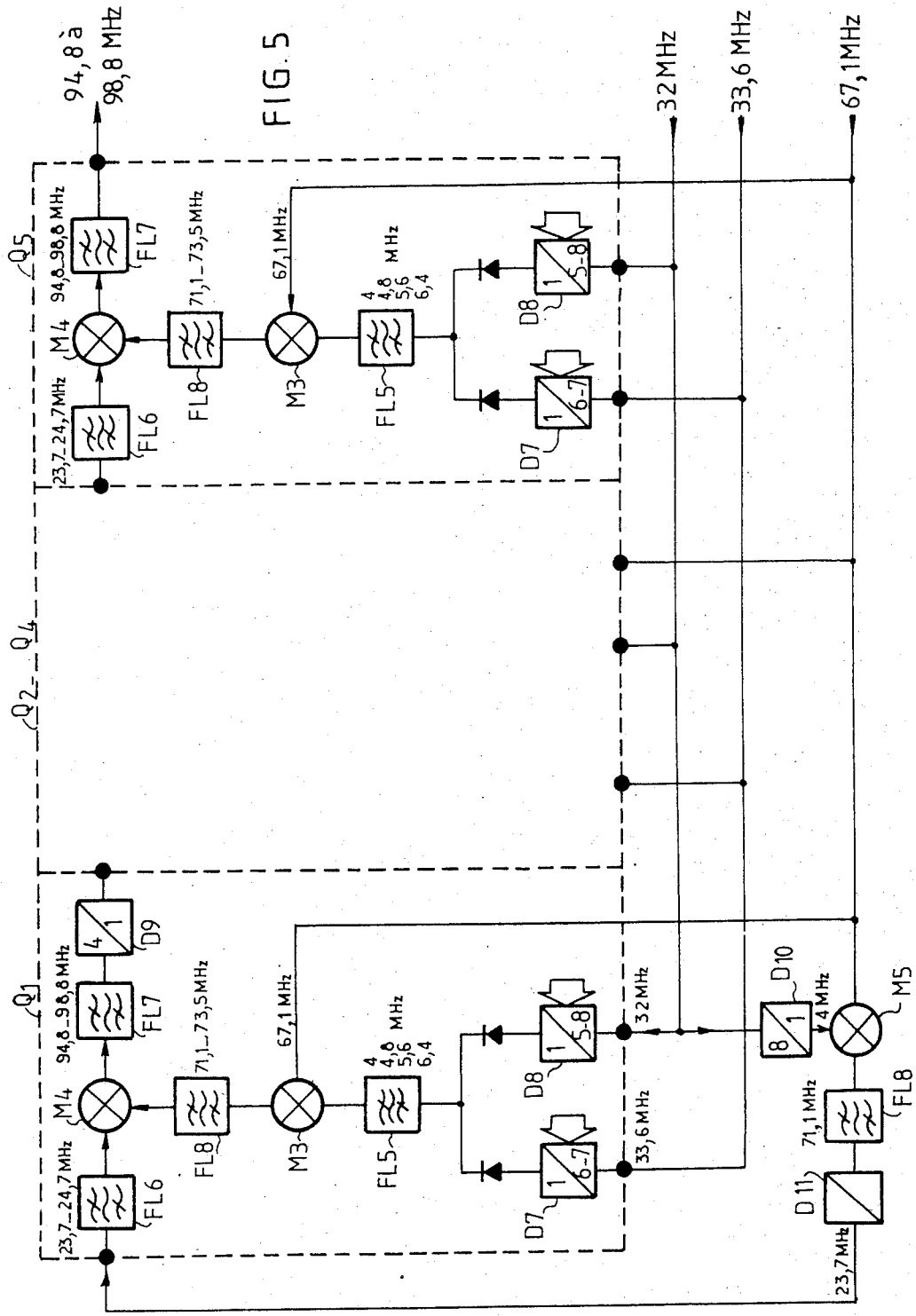

QUATERNARY FREQUENCY SYNTHESIZER

BACKGROUND OF THE INVENTION

In U.S. Pat. No. 4,008,443 filed by the Applicant on June 27, 1974, an iterative frequency synthesizer has been described whose basic element is a "quaternade", that is to say means for inserting a local frequency increment insertion means comprising a variable frequency taking on, in any order, one of four arithmetic progression values.

To construct a "quaternary" synthesizer, i.e. supplying the frequency to be synthesized by generating, in its different successive stages, significant digits of the number which expresses this frequency in the 4 base numeration system, it is sufficient for each stage to comprise a mixer providing a beat between the frequency from the preceding stage and a local variable frequency incremented by the four above mentioned arithmetic progression values.

If the mixing is additive, the local frequency must comprise a fixed part three times that of the input frequency of the stage.

If the mixing is subtractive, the local frequency must comprise a fixed part five times that of the input frequency of the stage.

In both cases it is sufficient to divide the frequency from the mixer by 4 so as to bring its fixed part to the same value at the output of the different stages.

According to an important feature of the above mentioned patent, the generation of the four arithmetic progression frequency values is provided from a single standard frequency, by dividing the standard frequency by fixed ratios which may take on at least two different values depending on the code which programs the synthesizer and selecting harmonics of the frequencies resulting from these divisions.

In the embodiment described in the above mentioned patent, two such divisions are effected in series, the first with two values of the rate and the second with four values.

SUMMARY OF THE INVENTION

A first object of the present invention is to simplify the harmonic filtering. This result is obtained by effecting two parallel divisions, each with two values of the divider ratio and by mixing the two frequencies thus obtained, which may take on two values each.

A second object of the invention is to do away with the need to generate harmonics, so as to avoid the use of a multiplier.

This result is obtained by effecting two parallel divisions, each with two values of the divider ratio, starting from two separate standard frequencies.

The basic element has been used, in the embodiments described in the above mentioned patent, for constructing a quaternary synthesizer.

The invention proposes using it for forming a decimal synthesizer.

For this purpose, according to another feature of the invention, each decade of the synthesizer is formed by two cascade connected elements, the first of which comprises a mixer which provides a beat between the frequency from the preceding decade and a local frequency taking on, depending on the programming code, values taken from a first set of four arithmetic progression values, said mixer being followed by a divide-by-two divider and in which the second element comprises a mixer which provides the beat between the frequency from the first element and a local frequency taking on, depending on the programming code, values taken from a second set of four arithmetic progression values, followed by a divide-by-five divider, and means for selecting, from the sixteen programming codes which define all the possible combinations of the two sets of four values, the ten codes which determine the generation of ten arithmetic progression output frequencies with a frequency step equal to a tenth of the total increment of the decade.

In a preferred embodiment, the four possible ratio values of the dividers which each decade comprises are programmed from ten codes selected from their sixteen possible programming codes by converting these latter from the code 1-2-4-8 into a code 1-2-2-4.

In a particularly simple embodiment, the two sets of values are identical, the first of these values being three times the fixed part of the frequency from the preceding stages.

BRIEF DESCRIPTION OF THE DRAWINGS

Other features and advantages of the invention will be clear from the following description.

In the accompanying drawing:

FIG. 5 illustrates one embodiment of a quaternary synthesizer using such a quaternade.

DESCRIPTION OF THE PREFERRED EMBODIMENTS

Figure 1:
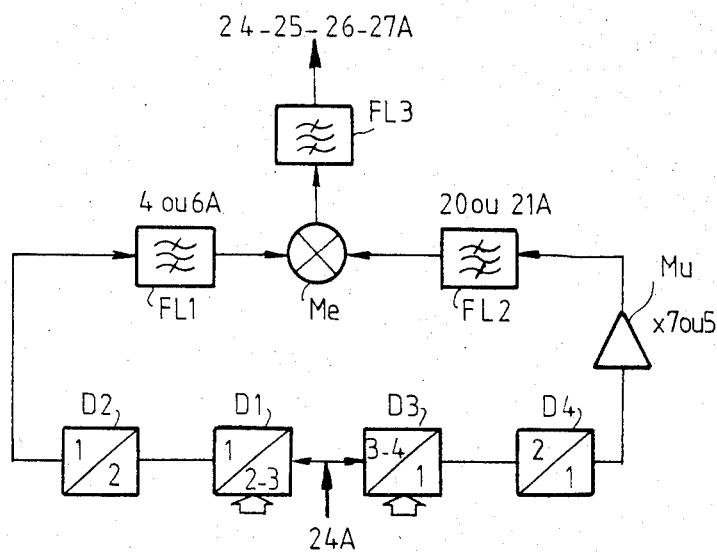
FIG. 1 is the diagram of a basic quaternary generator for forming a decimal synthesizer decade in accordance with a first preferred embodiment of the invention.

In FIG. 1 is shown the generation of a frequency capable of taking on any one of four arithmetic progression values 24A, 25A, 26A and 27A, depending on the programmed variable division ratios of two dividers D1 and D3 supplied with a standard frequency of 24A.

In such a circuit, A is the smallest frequency increment which a synthesizer formed from the basic element shown may generate.

Division of 24A by two or by three in D1 gives the values 12A and 8A, divided by two in a fixed divider D2 to give 6A or 4A. This first frequency 6A or 4A is filtered by the band pass filter FL1 and is applied to a mixer Me.

A second frequency, also applied to Me after filtering by FL2, takes on the values 20A or 21A obtained by dividing 24A by 3 or 4, by dividing the result by 2 in a fixed divider D4 and by forming the harmonic 5 of frequency 4A and the harmonic 7 of frequency 3A in a multiplier Mu.

It will be noted that, in the solution which has just been described, the filtering problems are very simple to resolve, because the frequencies to be eliminated are far from the necessary pass band for filter FL3.

Figure 2:
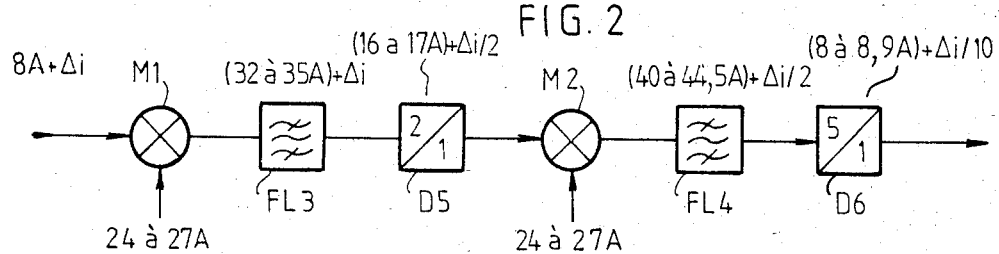
FIG. 2 shows said decade.

A first and a second frequency taking on the whole of values 24A-25A-26A-27A are applied respectively to the mixer M1 of a first component element of the decade shown in FIG. 2 and to the mixer M2 of a second element in series with the first one. It should be well understood that two quaternary generators such as the one shown in FIG. 1 are required, for though the two assemblies are identical, the values selected by the program of this synthesizer for synthesizing any given frequency are not identical.

Since the decade illustrated is assumed to occupy any rank i in the synthesizer, its input frequency comprises a carrier Fo here equal to 8A, for example and an increment $\Delta i$. The additive beat with the frequencies 24A to 27A, filtered by FL3, gives frequencies (32A to 35A) $+\Delta i$ which division by 2 in D5 brings down to $(16A+17.5A)+\Delta i/2$.

The beat between this frequency and the frequency 24A to 27A in M2, filtered by FL4, gives a frequency $(40A$ to $44.5A)+\Delta i/2$ which, after being divided by 5 in D6, gives $(8A$ to $8.9A)+\Delta i/10$.

The table below shows the set of output frequencies Fs (not taking into account the term $\Delta i/10$) for the possible different values of the frequencies F1 and F2 applied respectively to M1 and M2 from quaternary generators:

| F1 | F2 | Fs  | N° | 1-2-4-8 | | | | 1-2-2-4 | | | |
|----|----|-----|----|---|---|---|---|---|---|---|---|
| 24 | 24 | 8   | 0  |   |   |   |   |   |   |   |   |
| 25 | 24 | 8.1 | 1  | X |   |   |   | X |   |   |   |
| 26 | 24 | 8.2 | 2  |   | X |   |   |   | X |   |   |
| 27 | 24 | 8.3 | 3  | X | X |   |   | X | X |   |   |
| 24 | 26 | 8.4 | 4  |   |   | X |   |   |   |   | X |
| 25 | 26 | 8.5 | 5  | X |   | X |   | X |   |   | X |
| 26 | 26 | 8.6 | 6  |   | X | X |   |   | X |   | X |
| 27 | 26 | 8.7 | 7  | X | X | X |   | X | X |   | X |
| 26 | 27 | 8.8 | 8  |   |   |   | X |   | X | X | X |
| 27 | 27 | 8.9 | 9  | X |   |   | X | X | X | X | X |
| 24 | 25 | 8.2 | 10 |   | X |   | X |   |   |   |   |
| 25 | 25 | 8.3 | 11 | X | X |   | X |   |   |   |   |
| 26 | 25 | 8.4 | 12 |   |   | X | X |   |   |   |   |
| 27 | 25 | 8.5 | 13 | X |   | X | X |   |   |   |   |
| 24 | 27 | 8.6 | 14 |   | X | X | X |   |   |   |   |
| 25 | 27 | 8.7 | 15 | X | X | X | X |   |   |   |   |

In the table have been shown the numbers, going from 0 to 15, of the sixteen possible combinations of the codes for programming the dividers of said generators and the translation of these numbers into BCD code 1-2-4-8 and into the code 1-2-2-4.

Figure 4:
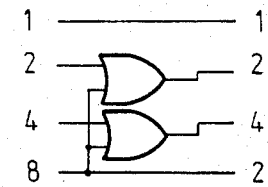
FIG. 4 shows a logic code conversion circuit used with the quaternade of FIG. 3.

Since the programming computer of the synthesizer which calculates the codes for each desired value of Fs, supplies said codes in BCD, it is sufficient to convert them into the code 1-2-2-4 in order to eliminate the six redundant combinations. A converter circuit, formed from two OR gates, is illustrated in FIG. 4.

Figure 3:
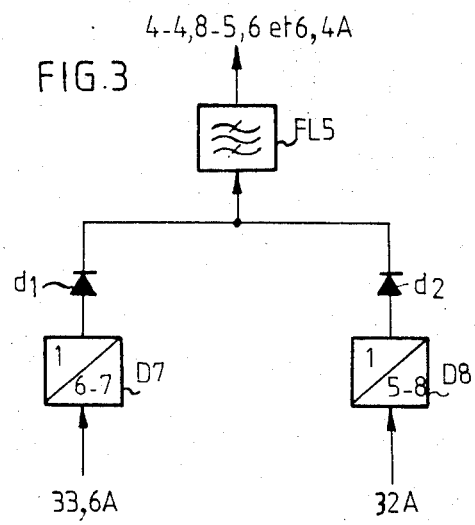
FIG. 3 shows a "quaternade" according to another embodiment.

The "quaternade" illustrated in FIG. 3 uses two standard frequencies, 33.6A and 32A in the example described, which are divided respectively by 6 or 7 and by 5 or 8 in the dividers D7 and D8 so as to give, after filtering in FL5, four values 4A; 4.8A; 5.6A; and 6.4A.

Diodes d1 and d2 provide transmission of the signal from that one of the two dividers which is active for a code considered.

The purpose of filter FL5 is here solely to eliminate the parasite harmonics generated by dividers D7 and D8.

By way of example of application of such a "quaternade", in FIG. 5 is shown a 94.8 to 98.8 MHz synthesizer comprising four identical quaternades Q1, Q2, Q4, and Q5, in which the generator of four arithmetic progression frequency values is identical to the one shown in FIG. 3 and an output quaternade Q5 which is distinguished from the preceding ones by the absence of divider D9.

Three standard frequencies are used, namely: 32 MHz and 33.6 MHz, which are applied to dividers D7 and D8 of each quaternade and 67.1 MHz.

This latter is, on the one hand, applied to a mixer M3 which also receives the output frequency from FL5 (taking on the values 4, 4.8, 5.6 and 6.4 MHz as explained above), and on the other hand to a mixer M5 which further receives a frequency of 4 MHz obtained by division of the 32 MHz frequency in divider D10. The additive 71.1 MHz beat is filtered in FL8, then divided by three in a divider D11 to give a frequency of 23.7 MHz. This latter frequency, after filtering in FL6, is mixed in M4 with the additive beat in M3, filtered in FL8, between the frequency from FL5 and standard frequency of 67.1 MHz.

The frequency from M4, after filtering in FL7, is divided by four in D9 and applied to the following quaternade. Thus, the four values 94.8 MHz; 95.6 MHz; 96.4 MHz and 97.2 MHz are obtained which, after being divided by four, give 23.7; 23.9; 24.1 and 24.3 MHz.

In the second quaternade Q2 there is obtained, for each of the above frequencies 23.7; 23.9; 24.1 and 24.3 MHz, four frequencies the last of which (24.9 MHz) for those which correspond to 24.3 MHz, will be eliminated by FL6.

Similarly, for each of the the fifteen output frequencies from Q2, there will be obtained at the output of Q3 four frequencies of which those which exceed 24.7 MHz will be eliminated by FL6. Finally, since the last quaternade Q5 does not comprise any divide-by-4 divider D9, frequencies will be obtained at its output varying from 94.8 to 90.8 MHz.

It goes without saying that the circuits described and illustrated may be modified, without departing from the spirit of the invention.

What is claimed is:

1. A frequency synthesizer comprising:
   i. generator means for generating a standard frequency which is a multiple of a predetermined frequency step;
   ii. first and second frequency dividers respectively having first and second inputs connected in parallel to the said generator means and each having first and second programmable ratios of division, said first and second frequency divider respectively having first and second outputs and respectively producing first and second and fourth and fifth further frequencies;
   iii. first and second band-pass filter means having first and second respective inputs and frequency converter means respectively connecting said first and second outputs of the frequency dividers to the first and second inputs of the band-pass filter means which are respectively adapted for transmitting the first and second and third and fourth further frequencies, said first and second filter means respectively having first and second outputs, and
   iv. mixer means having first and second inputs respectively connected to the first and second outputs of the filter means, said mixer means having an output and
   v. third band-pass filter means connected to the output of the inner means,
   vi. the third filter means being adapted for transmitting fifth, sixth, seventh and eighth further frequencies in arithmetic progression, the first, second, third and fourth further frequencies being so predetermined that the said fifth, sixth, seventh and eighth frequencies will be obtained at the output of the mixer means and the frequency converter means have a fixed factor of frequency conversion.

2. A frequency synthesizer as claimed in claim 1, wherein the frequency converter means include a frequency multiplier.

3. A decimal frequency synthesizer device comprising:
i. first and second frequency synthesizers as claimed in claim 1;
ii. first further mixer means having a first input to which the output of the third filter means of the first frequency synthesizer is connected and a second input on which a frequency which comprises a fixed part which is a multiple of said predetermined frequency step and a variable frequency increment is applied, said first further mixer means having an output;
iii. a divide-by-two divider having an input and an output and band-pass filter means connecting the input of said divide-by-two divider to the output of the first further mixer means;
iv. second further mixer means having an output, a first input to which the output of the third filter means of the second frequency synthesizer is connected and a second input which is connected to the output of the divide-by-two divider;
v. a divide-by-five divider having an input and band-pass filter means connecting the input of the divide-by-five divider to the output of the second further mixer means, said divide-by-five divider having an output on which ten output frequencies in an arithmetic progression the ratio of which is a tenth of the said predetermined frequency step, are generated for each value of the said variable frequency increment, the first of said ten frequencies having a fixed part equalling the fixed part of the frequency applied to the second input of the first further mixer means;
vi. means for programming from sixteen digitally coded numbers the ten respective ratios of division of the first and second frequency dividers of each of said first and second frequency synthesizers in such a manner that the said ten output frequencies are obtained.

4. A frequency synthesizer comprising:
i. first and second generator means for respectively generating first and second standard frequencies each of which is an integral multiple of a predetermined frequency step;
ii. first and second frequency dividers respectively having first and second inputs which are respectively connected to said first and second generator means and each having first and second programmable ratios of division, said first and second frequency dividers respectively having first and second outputs;
iii. band-pass filter means having an input and frequency keeping signal transfer means connecting the said input of the band-pass filter means to said first and second outputs of the frequency dividers;

iv. the band-pass filter means being adapted for transmitting first, second, third and fourth predetermined frequencies in arithmetic progression.

5. A decimal frequency synthesizer device comprising:
i. first and second frequency synthesizers as claimed in claim 4;
ii. first further mixer means having a first input to which the output of the third filter means of the first frequency synthesizer is connected and a second input on which a frequency which comprises a fixed part which is a multiple of said predetermined frequency step and a variable frequency increment is applied, said first further mixer means having an output;
iii. a divide-by-two divider having an input and an output and band-pass filter means connecting the input of said divide-by-two divider to the output of the first further mixer means;
iv. second further mixer means having an output, a first input to which the output of the third filter means of the second frequency synthesizer is connected and a second input which is connected to the output of the divide-by-two divider;
v. a divide-by-five divider having an input and band-pass filter means connecting the input of the divide-by-five divider to the output of the second further mixer means, said divide-by-five divider having an output on which ten output frequencies in an arithmetic progression the ratio of which is a tenth of the said predetermined frequency step, are generated for each value of the said variable frequency increment, the first of said ten frequencies having a fixed part equalling the fixed part of the frequency applied to the second input of the first further mixer means;
vi. means for programming from sixteen digitally coded numbers the ten respective ratios of division of the first and second frequency dividers of each of said first and second frequency synthesizers in such a manner that the said ten output frequencies are obtained.

6. A decimal frequency synthesizer device as claimed in claim 3, wherein the said means for programming the ten ratios of division include logic circuit means for converting the said coded number from a 1-2-4-8 code to a 1-2-2-4 code.

7. A decimal frequency synthesizer device as claimed in claim 5, wherein the said means for programming the ten ratios of division include logic circuit means for converting the said coded number from a 1-2-4-8 code to a 1-2-2-4 code.

8. A decimal frequency synthesizer device as claimed in claim 3, wherein the standard frequencies of the first and second frequency synthesizers are identical and equal three times the fixed part of the frequency applied to the second input of the first further mixer means.

9. A decimal frequency synthesizer device as claimed in claim 5, wherein the standard frequencies of the first and second frequency synthesizers are identical and equal three times the fixed part of the frequency applied to the second input of the first further mixer means.

* * * * *